(12) United States Patent
Iwasaki

(10) Patent No.: US 10,048,305 B2
(45) Date of Patent: Aug. 14, 2018

(54) SEMICONDUCTOR ABNORMALITY DETECTION CIRCUIT

(71) Applicant: YAZAKI CORPORATION, Tokyo (JP)

(72) Inventor: Katsuyuki Iwasaki, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 549 days.

(21) Appl. No.: 14/564,570

(22) Filed: Dec. 9, 2014

(65) Prior Publication Data
US 2015/0162747 A1 Jun. 11, 2015

(30) Foreign Application Priority Data

Dec. 10, 2013 (JP) ................................. 2013-254921

(51) Int. Cl.
*G01R 31/02* (2006.01)
*H02H 9/04* (2006.01)
(Continued)

(52) U.S. Cl.
CPC ......... *G01R 31/024* (2013.01); *G01R 31/025* (2013.01); *G01R 31/2607* (2013.01);
(Continued)

(58) Field of Classification Search
CPC .......... H02H 5/10; H02H 9/045; H05B 41/02; H05B 41/04; H05B 41/042; G01R 31/024;
(Continued)

(56) References Cited

U.S. PATENT DOCUMENTS 4,979,066 A    12/1990  Kawata et al.
5,311,138 A *   5/1994  Ott ..................... G01R 31/3275
                                                324/503
(Continued)

FOREIGN PATENT DOCUMENTS

CN       1459922 A    12/2003
CN     102242679 A    11/2011
(Continued)

OTHER PUBLICATIONS

Communication dated Nov. 9, 2016 issued by the German Patent Office in counterpart German Patent Application No. 102014225331.4.
(Continued)

*Primary Examiner* — Thienvu Tran
*Assistant Examiner* — Christopher Clark
(74) *Attorney, Agent, or Firm* — Sughrue Mion, PLLC

(57) ABSTRACT

A semiconductor abnormality detection circuit includes a semiconductor circuit and a controller which controls supply of power to a load. The semiconductor circuit includes a switch device disposed between a power source and the load, and a sense signal generator generating a sense signal corresponding to a current flowing through the switch device. The controller judges that the semiconductor circuit is operating normally if the instruction voltage level is equal to an off-voltage corresponding to non-energization of the switch device and a voltage of the sense signal is equivalent to a prescribed off-voltage corresponding to non-energization of the switch device or the instruction voltage level is equal to an on-voltage corresponding to energization of the switch device and a voltage of the sense signal is equivalent to a prescribed on-voltage corresponding to a steady energization state of the load.

6 Claims, 10 Drawing Sheets

(51) Int. Cl.
- *H02H 9/02* (2006.01)
- *H03K 17/18* (2006.01)
- *G01R 31/327* (2006.01)
- *G01R 31/26* (2014.01)

(52) U.S. Cl.
CPC ............. *G01R 31/327* (2013.01); *H02H 9/02* (2013.01); *H02H 9/045* (2013.01); *H03K 17/18* (2013.01)

(58) Field of Classification Search
CPC . G01R 31/025; G01R 31/2607; G01R 31/327
See application file for complete search history.

(56) References Cited

U.S. PATENT DOCUMENTS

| | | |
|---|---|---|
| 2001/0022715 A1 | 9/2001 | Fukami |
| 2003/0218443 A1 | 11/2003 | Nakamichi et al. |
| 2006/0256497 A1* | 11/2006 | Sugimura .......... G01R 31/3278 361/160 |
| 2008/0048877 A1 | 2/2008 | Takahashi |

FOREIGN PATENT DOCUMENTS

| | | |
|---|---|---|
| DE | 3906886 A1 | 9/1989 |
| JP | 2004-153952 A | 5/2004 |
| JP | 2008-022152 A | 1/2008 |
| JP | 2010-158108 A | 7/2010 |

OTHER PUBLICATIONS

Communication dated May 15, 2017, issued by the State Intellectual Property Office of People's Republic of China in counterpart Chinese Patent Application No. 201410756696.0.

Communication issued by the State Intellectual Property Office of P.R. China dated Dec. 1, 2017 in counterpart Chinese Patent Application No. 201410756696.0.

\* cited by examiner

FIG. 2

| NORMAL STATE | | | SHORT CIRCUIT BETWEEN POWER SOURCE TERMINAL AND OUTPUT TERMINAL | | |
|---|---|---|---|---|---|
| BINARY SIGNAL SG1 | OUTPUT SIGNAL SG2 | SENSE SIGNAL SG3 | BINARY SIGNAL | OUTPUT SIGNAL | SENSE SIGNAL |
| LO | GND | GND | LO | HI | VOLTAGE OTHER THAN GND |
| HI | HI | VOLTAGE PROPORTIONAL TO CURRENT | HI | HI | GND LEVEL OR VOLTAGE OTHER THAN EXPECTED VOLTAGE |

SEMICONDUCTOR ABNORMALITY DETECTION CIRCUIT

BACKGROUND

The present disclosure relates to a semiconductor abnormality detection circuit which can be used for detecting occurrence of an abnormality in a semiconductor switch device that on/off-controls energization of a load.

For example, various electric devices are provided as loads of a power source in vehicles. Power from a vehicle-side power source is supplied to such loads via respective switch devices. For example, if a user manipulates a certain button, an electronic control unit (ECU) on the vehicle detects the manipulation and switches the corresponding switch device from an off-state to an on-state. As a result, power from a vehicle-side power source is supplied to a corresponding electric device via the switch device.

In general, switch devices for controlling various electric devices are provided as loads in vehicles are mechanical relays. However, in recent years, they have been being replaced by semiconductor switch devices such as power MOS transistors (FETs). The use of semiconductor switch devices enables reduction in size and weight of devices.

However, semiconductor switch devices may suffer such a failure as a short circuit (between input and output terminals) or an open failure (e.g., disconnection). Furthermore, because of absence of a movable portion such as an electric contact, occurrence/non-occurrence of a failure in a semiconductor switch device cannot be recognized visually or by a working sound.

For example, if a semiconductor switch device is short-circuited, an event may last for a long time that an excessive current flows through the load or the load consumes power wastefully. It is therefore necessary to detect a failure in semiconductor switch devices.

Among conventional techniques relating to detection of a failure of a semiconductor switch device are ones disclosed in JP-A-2008-22152 and JP-A-2010-158108.

JP-A-2008-22152 proposes a technique of a power supply control device which makes it possible to detect, for example, short-circuiting between the input and the output of a semiconductor switch device while suppressing an erroneous detection due to electromotive force of a load motor. More specifically, a judgment signal is generated by comparing a drain-source voltage Vds and a gate-source voltage Vgs of a power MOS transistor (semiconductor switch device) with respective threshold values.

JP-A-2010-158108 proposes a technique of a protective device for a load circuit which enables size reduction of a semiconductor relay and wires. More specifically, a load current is measured by an ammeter and the measured current value is compared with a dead short judging current Imax. Furthermore, a quantity of generated heat and a quantity of radiated heat of a wire are calculated by applying the measured current value to a heat generation equation and a heat radiation equation, respectively.

However, in the technique of JP-A-2008-22152, relatively complicated circuits need to be added to detect voltages Vds and Vgs and compare them with the respective threshold values. Furthermore, since these circuits need to be added for each semiconductor switch, a substantial cost increase is incurred when the number of loads is large.

The technique of JP-A-2010-158108 is associated with various problems relating to the ammeter because it is necessary to directly measure a current flowing from the output terminal of the semiconductor switch to the load. For example, where a detection resistor is inserted in a line through which a current is to flow, the number of wiring steps is increased much and it is necessary to take into consideration adverse effects on the load due to a voltage drop across the resistor. Where a current is detected using a coil that is coupled to a line through a load current is to flow, the ammeter cost may increase to a large extent.

Among methods other than the methods of JP-A-2008-22152 and JP-A-2010-158108 is one in which the voltage across a load is monitored. However, also in this method, many components need to be added and hence a substantial cost increase is incurred when the number of loads is large. Furthermore, occurrence/non-occurrence of a failure cannot be recognized correctly in a situation that a power source voltage is not supplied as in a case that the ignition switch of a vehicle is off.

SUMMARY

The present disclosure has been made in the above circumstances, and an object of the present disclosure is therefore to provide a semiconductor abnormality detection circuit which can recognize occurrence/non-occurrence of a failure in a semiconductor switch device with high reliability at a low cost.

To attain the above object, the invention provides semiconductor abnormality detection circuits that are characterized as the following items (1)-(7):

(1) A semiconductor abnormality detection circuit comprising:
  a semiconductor circuit including:
  a switch device disposed in a conductive path between a power source and a load; and
  a sense signal generator which generates a sense signal corresponding to a current flowing through the switch device; and
  a controller which controls supply of power to the load by binarily switching between high and low levels of an instruction voltage that is applied to a control input terminal of the switch device,
  wherein the controller judges that the semiconductor circuit is operating normally if the instruction voltage level is equal to an off-voltage corresponding to non-energization of the switch device and a voltage of the sense signal is equivalent to a prescribed off-voltage corresponding to non-energization of the switch device or the instruction voltage level is equal to an on-voltage corresponding to energization of the switch device and a voltage of the sense signal is equivalent to a prescribed on-voltage corresponding to a steady energization state of the load.

(2) The semiconductor abnormality detection circuit according to item (1), the controller judges that the semiconductor circuit is operating normally if the voltage of the sense signal is equivalent to the prescribed off-voltage when the instruction voltage level is equal to the off-voltage and the voltage of the sense signal is equivalent to the prescribed on-voltage when the instruction voltage level is equal to the on-voltage.

(3) The semiconductor abnormality detection circuit according to item (2), wherein the controller detects a voltage of the sense signal when the instruction voltage level is equal to the off-voltage and then detects a voltage of the sense signal when the instruction voltage level is equal to the on-voltage.

(4) The semiconductor abnormality detection circuit according to any one of items (1) to (3), further comprising:

a control circuit configured to communicate a signal with the semiconductor circuit, wherein the control circuit includes the controller.

(5) The semiconductor abnormality detection circuit according to any one of items (1) to (3), wherein the semiconductor circuit includes the controller.

(6) The semiconductor abnormality detection circuit according to item (4), further comprising:

a monitor signal line through which a signal equivalent to a voltage appearing at an output terminal of the switch device is input to the control circuit, wherein the control circuit judges whether the semiconductor circuit is operating normally based on the voltage of the sense signal and a voltage that is received through the monitor signal line.

(7) The semiconductor abnormality detection circuit according to any one of items (1) to (6), wherein the controller detects a voltage of the sense signal after waiting until passage of at least a predetermined delay time from a change of the instruction voltage level to the on-voltage.

The semiconductor abnormality detection circuit having the configuration of item (1) can determine whether or not the switch device is suffering a failure such as a short circuit or an open failure. Since a state of the switch device is determined by monitoring the voltage of the sense signal, the number of additional components can be reduced and cost reduction can be attained. Furthermore, since a state of the switch device is determined on the basis of the magnitude of the load current while monitoring the sense signal, failures other than a complete short circuit and a complete open failure can also be detected.

The semiconductor abnormality detection circuit having the configuration of item (2) can reliably detect a failure irrespective of whether it is a short circuit or an open failure. Furthermore, failures other than a complete short circuit and a complete open failure can also be detected.

The semiconductor abnormality detection circuit having the configuration of item (3) can shorten the time that is required for determination of a failure. For example, in the case of an electric device provided in a vehicle, energization of the load is started by a certain trigger after turning-on of the ignition switch. In this case, the level of the instruction voltage for controlling the switch device is equal to an off-voltage at the beginning and turns to an on-voltage in response to a trigger. Therefore, by detecting a voltage of the sense signal when the instruction voltage level is equal to the off-voltage and then detecting a voltage of the sense signal when the instruction voltage level is equal to the on-voltage, occurrence/non-occurrence of a failure can be determined without the need for performing detecting operations many times.

In the semiconductor abnormality detection circuit having the configuration of item (4), the control circuit that is provided outside the semiconductor circuit determines occurrence/non-occurrence of a failure in the switch device. Therefore, occurrence/non-occurrence of a failure can be determined using an existing semiconductor circuit as it is.

In the semiconductor abnormality detection circuit having the configuration of item (5), the control unit that is incorporated in the semiconductor circuit determines occurrence/non-occurrence of a failure in the switch device. Therefore, a failure can be detected even in a case that a special device such as a microcomputer is not provided outside the semiconductor device and the semiconductor abnormality detection circuit can be miniaturized.

The semiconductor abnormality detection circuit having the configuration of item (6) can produce a more reliable recognition result because occurrence/non-occurrence of a failure is determined on the basis of two systems of signals that are output from different locations.

The semiconductor abnormality detection circuit having the configuration of item (7) can determine occurrence/non-occurrence of a failure correctly even in a case that a load itself incorporates a special switch and is energized with independent timing. For example, in the case of such a load as a vehicular HID (high-intensity discharge) lamp or LED (light-emitting diode) lamp, a current starts to flow through the load after passage of a certain delay time from the start of supply of a power source voltage to the load. Correct detection of a failure is enabled by taking a timing deviation due to such a delay time into consideration.

The semiconductor abnormality detection circuits according to the invention can determine occurrence/non-occurrence of a failure in a semiconductor switch device with high reliability at a low cost.

The invention has been summarized above concisely. The details of the invention will become more apparent when the section "modes for carrying out the invention" (hereinafter referred to as embodiments) is read with reference to the accompanying drawings.

BRIEF DESCRIPTION OF THE DRAWINGS

The above objects and advantages of the present invention will become more apparent by describing in detail preferred exemplary embodiments thereof with reference to the accompanying drawings, wherein:

FIG. 2 shows a table of corresponding relationships between signal potentials of individual portions of the electronic control unit shown in FIG. 1;

DETAILED DESCRIPTION OF EXEMPLARY EMBODIMENTS

Semiconductor abnormality detection circuits according to specific embodiments of the present disclosure will be hereinafter described with reference to the drawings.

Embodiment 1

Figure 1:
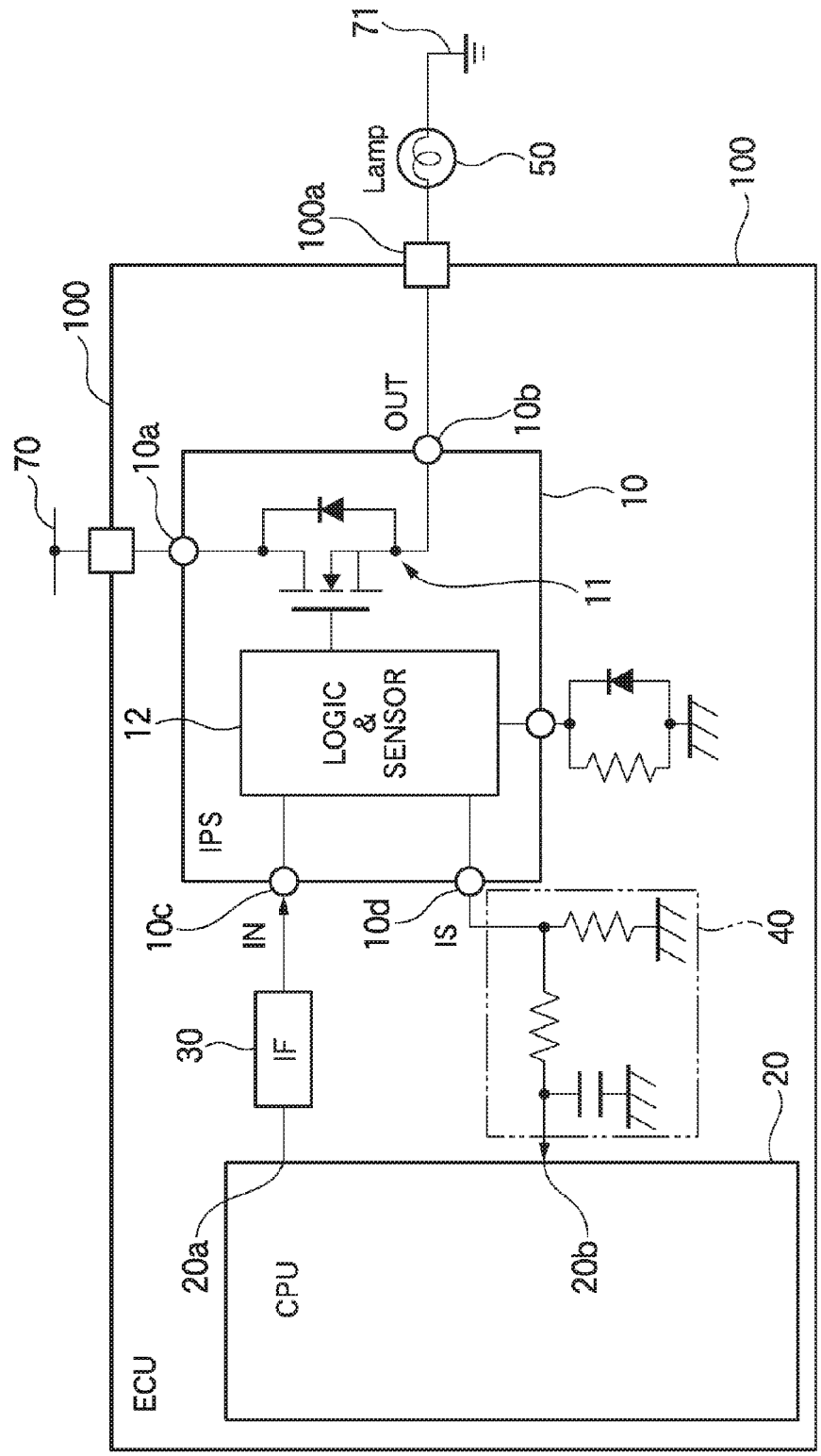
FIG. 1 is a block diagram showing the configuration of an electronic control unit (example configuration (1)) including a semiconductor abnormality detection circuit.

FIG. 1 shows the configuration of an electronic control unit (ECU) 100 (example configuration (1)) including a semiconductor abnormality detection circuit according to the invention.

<Outline of ECU>

The electronic control unit 100 is provided in a vehicle, for example, and serves to control various electric devices (represented by a load 50) installed in the vehicle. That is, the electronic control unit 100 serves to on/off-control the supply of power to the load 50 from a power line 70. A DC voltage of +12 V, for example, is supplied to the power line 70 from the vehicle side. When a switch provided in the electronic control unit 100 is turned on, the power source voltage (+12 V) is supplied to the load 50 from the power line 70 via the electronic control unit 100 and a current flows from the load 50 to a ground line 71. Specific examples of the load 50 are various electric devices such as lamps (e.g., a headlight and a tail lamp).

The electronic control unit 100 shown in FIG. 1 incorporates a semiconductor switch device 11 as a switch for on/off-controlling the load 50. Semiconductor switch devices may suffer a failure but occurrence/non-occurrence of a failure cannot be determined visually, for example, because of absence of an electric contact or a movable portion. Therefore, the electronic control unit 100 is equipped with a semiconductor abnormality detection circuit for detecting a failure (a short circuit or open failure) of the switch device 11.

<Configuration of ECU>

As shown in FIG. 1, the electronic control unit 100 incorporates a power semiconductor device 10, a microcomputer (CPU) 20, an interface (IF) 30, and a signal input circuit 40.

The power semiconductor device 10 is a device that is marketed as what is called an intelligent power switch (IPS) and incorporates the switch device 11 and a logic/sensor circuit 12.

The switch device 11 is mainly formed by a power MOSFET which is connected to the high-potential side of the load 50 and can operate as a high-side switch. The drain electrode of the power MOSFET is connected to a power input terminal 10a, its source electrode is connected to an output terminal (OUT) 10b, and its gate electrode is connected to the output of the logic/sensor circuit 12. That is, the switch device 11 is turned on or off according to the level (high or low) of an instruction voltage that is supplied from the output of the logic/sensor circuit 12 as a binary signal.

The logic/sensor circuit 12 has two main functions. That is, the logic/sensor circuit 12 generates a signal for turning on/off the switch device 11 according to the level (high or low) of an instruction voltage that is supplied a control input terminal (IN) 10c of the power semiconductor device 10. Furthermore, the logic/sensor circuit 12 detects a current flowing through the switch device 11 and generates a sense signal that is proportional to the detected current. The sense signal is output to a sense signal output terminal (IS) 10d.

For example, where the logic/sensor circuit 12 has a sense ratio 1/5,000, the logic/sensor circuit 12 outputs a current of 1 (mA) as a sense signal according to the sense ratio if a current of 5 (A) flows through the switch device 11. A signal input circuit 40 which is connected to the sense signal output terminal 10d converts the current value of the sense signal into a voltage and gives the latter to the microcomputer 20.

The microcomputer 20 realizes various functions that are necessary for control of the electronic control unit 100 by running programs that are incorporated therein in advance. These function include a function of diagnosing occurrence/non-occurrence of a failure (a short circuit, an open failure, or the like) in the switch device 11, as well as a function of generating a signal for on/off-controlling the load 50 on the basis of a detection result of a state of a manipulation switch (not shown) and recognition results of various situations.

The microcomputer 20 can output a binary signal for on/off-controlling the load 50 to an output port 20a. Furthermore, the microcomputer 20 can convert the analog level of a voltage applied to an analog input port 20b into a digital signal and thereby detect the voltage level.

<Judgment Conditions of Failure Diagnosis>

FIG. 2 shows a list of corresponding relationships between signal potentials of individual portions of the electronic control unit 100. FIG. 2 shows relationships between voltages of a binary signal SG1 (IN input) to be applied to the control input terminal 10c of the power semiconductor device 10, an output signal SG2 (OUT output) to appear at the output terminal 10b, and a sense signal SG3 to appear at the sense signal output terminal (IS) 10d.

In FIG. 2, symbol "LO" represents a low potential (i.e., a voltage close to 0 V) of the binary signal SG1 and "HI" represents a high potential (i.e., a voltage close to the power source voltage) of the binary signal SG1 or the output signal SG2. Symbol "GND" represents an analog voltage that is close to the ground potential.

For example, if the binary signal SG1 is "LO" when the power semiconductor device 10 is normal, the logic/sensor circuit 12 applies the low potential to the gate electrode of the switch device 11, continuity is not established between the drain electrode and the source electrode of the switch device 11 and hence the output signal SG2 appearing at the output terminal 10b has the "GND" potential. If the binary signal SG1 is "HI" when the power semiconductor device 10 is normal, the logic/sensor circuit 12 applies the high potential to the gate electrode of the switch device 11, continuity is established between the drain electrode and the source electrode of the switch device 11 and hence the output signal SG2 appearing at the output terminal 10b has the "HI" potential which is close to the voltage of the power line 70.

As shown in FIG. 2, each of the output signal SG2 and the sense signal SG3 has different voltages when the switch device 11 provided in the power semiconductor device 10 is normal and when it is suffering an abnormality such as a short circuit. Therefore, the microcomputer 20 can determine occurrence/non-occurrence of a failure by monitoring the voltage of the output signal SG2 or the sense signal SG3 and comparing it with a threshold value that corresponds to the level (high or low) of the binary signal SG1.

In the electronic control unit 100 shown in FIG. 1, the microcomputer 20 determines occurrence/non-occurrence of a failure by recognizing the level (high or low) of the binary signal SG1 on the basis of a signal that the microcomputer 20 itself outputs to the output port 20a and monitoring the voltage of the sense signal SG3 appearing at the analog input port 20b.

<Operation of Microcomputer 20>

In the electronic control unit 100 shown in FIG. 1, the microcomputer 20 can detect a semiconductor short circuit in the power semiconductor device 10 using one of two detection modes, that is, a first detection mode and a second detection mode.

Figure 3:
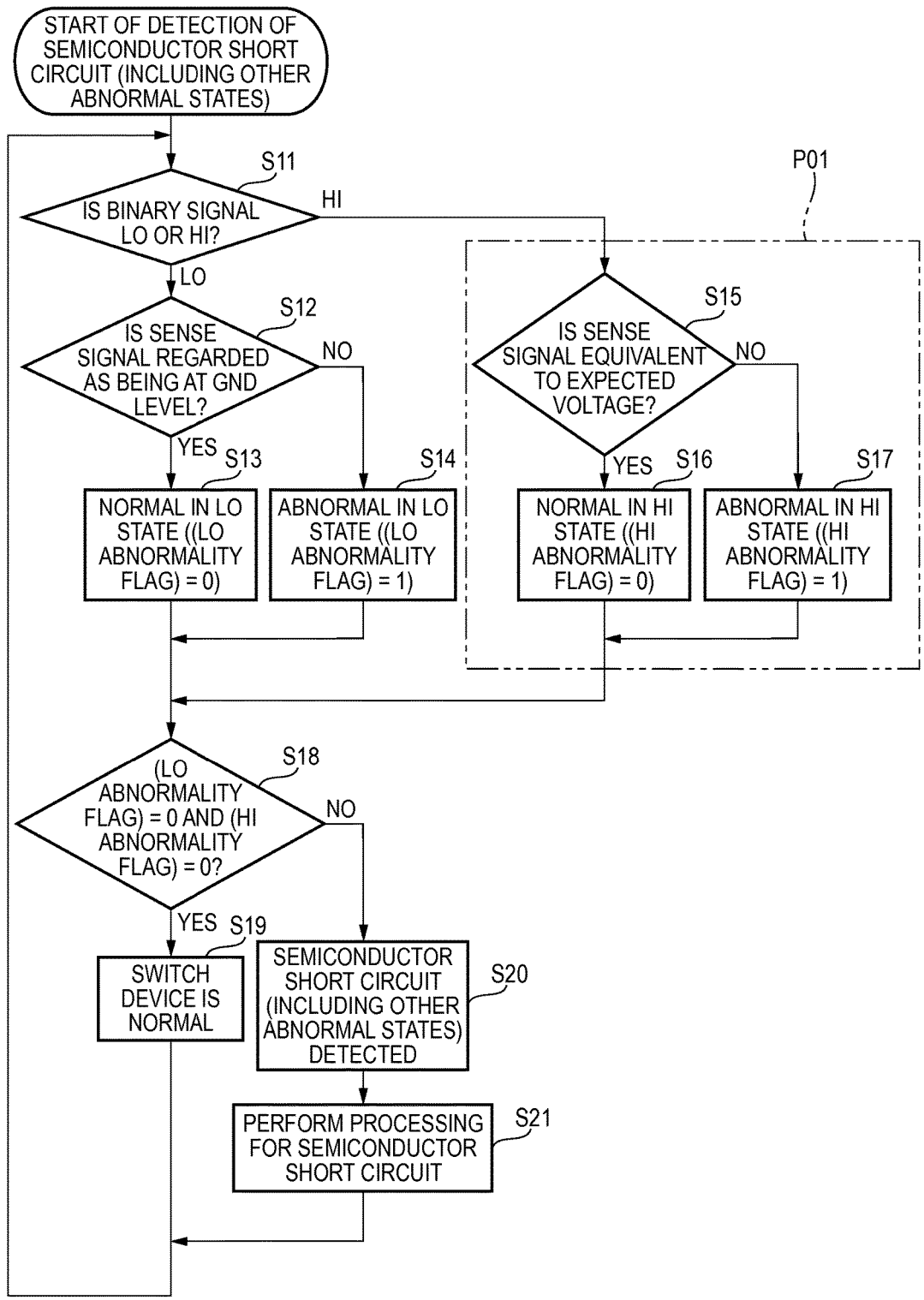
FIG. 3 is a flowchart showing details of a semiconductor short circuit detection process of a first detection mode.
Figure 4:
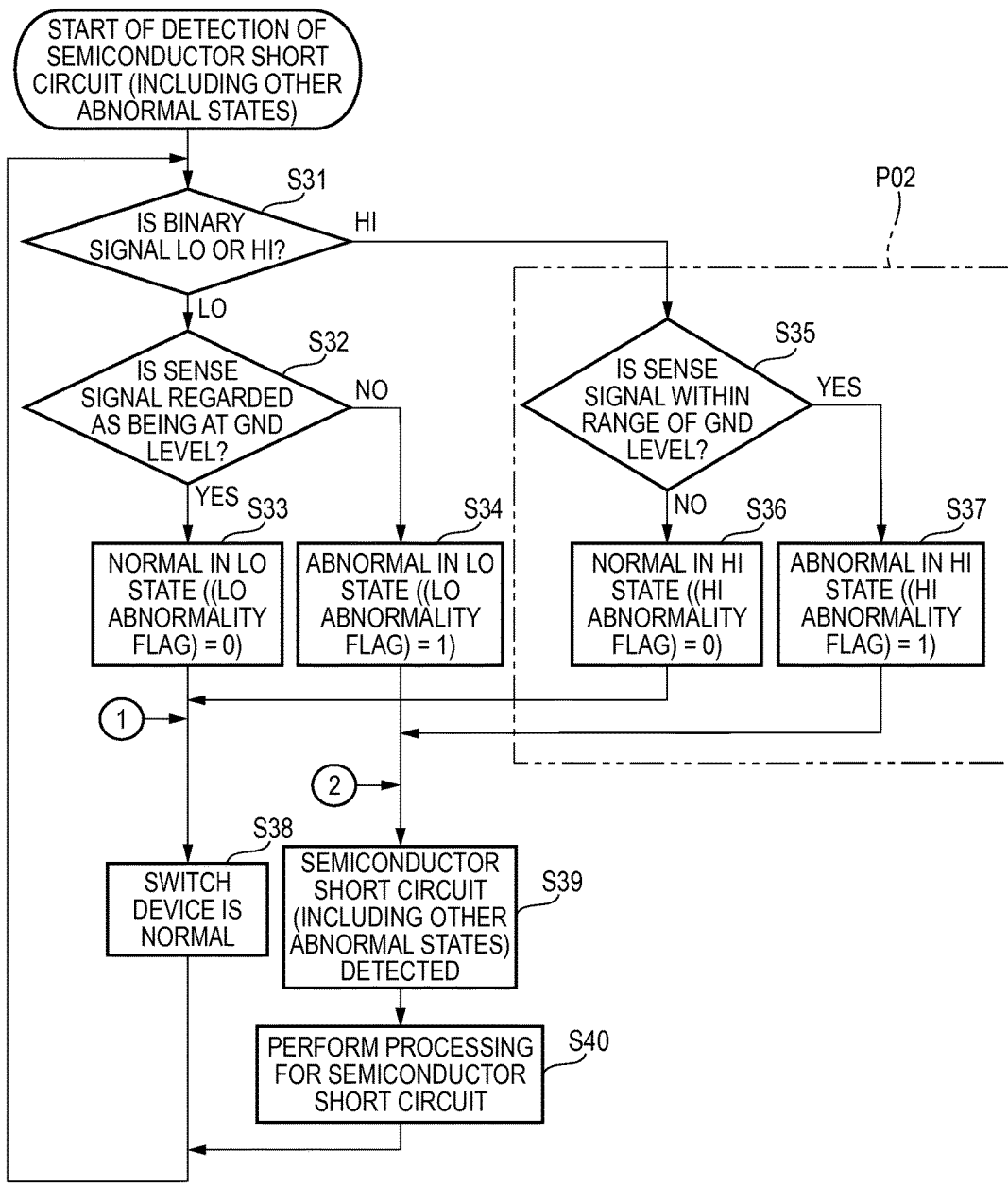
FIG. 4 is a flowchart showing details of a semiconductor short circuit detection process of a second detection mode.

FIG. 3 shows details of a semiconductor short circuit detection process of the first detection mode. FIG. 4 shows details of a semiconductor short circuit detection process of the second detection mode. How the microcomputer 20 operates in each of these detection modes will be described below.

<First Detection Mode>

The process shown in FIG. 3 employs an LO abnormality flag and an HI abnormality flag, both of which are cleared to "0" before execution of the process of FIG. 3, that is, in an initial state. The LO abnormality flag and an HI abnormality flag exist on an internal memory of the microcomputer 20.

At step S11 shown in FIG. 3, the microcomputer 20 judges whether the binary signal SG1 which is applied to the control input terminal 10c of the power semiconductor device 10 is "HI" or "LO." Since the HI/LO state or the binary signal SG1 is the same as that of the binary signal that the microcomputer 20 itself outputs to the output port 20a, actually the microcomputer 20 judges whether the binary signal that it outputs to the output port 20a is "HI" or "LO." The process moves to step S12 if the binary signal SG1 is "LO," and to step S15 if the binary signal SG1 is "HI."

At step S12, the microcomputer 20 detects a voltage of the sense signal SG3 at the analog input port 20b and compares the detected voltage with a predetermined threshold value. The process moves to step S13 if the voltage of the sense signal SG3 can be regarded as being at a "GND" level that is equivalent to the "GND" potential, and to step S14 if it cannot.

At step S13, the microcomputer 20 clears the LO abnormality flag to "0" to store information to the effect that the switch device 11 is normal in the state that the binary signal SG1 is "LO."

At step S14, the microcomputer 20 sets the LO abnormality flag to "1" to store information to the effect that the switch device 11 is abnormal in the state that the binary signal SG1 is "LO."

At step S15, the microcomputer 20 detects a voltage of the sense signal SG3 at the analog input port 20b and compares the detected voltage with a predetermined threshold value to judge whether or not the voltage of the sense signal SG3 is equivalent to an expected voltage. The expected voltage is a voltage that is determined by a rated current that flows through the load 50 in a normal state, the sense ratio of the logic/sensor circuit 12, and the characteristic of the signal input circuit 40. The process moves to step S16 if the voltage of the sense signal SG3 is equivalent to an expected voltage, and to step S17 if it is not.

At step S16, the microcomputer 20 clears the HI abnormality flag to "0" to store information to the effect that the switch device 11 is normal in the state that the binary signal SG1 is "HI."

At step S17, the microcomputer 20 sets the HI abnormality flag to "1" to store information to the effect that the switch device 11 is abnormal in the state that the binary signal SG1 is "HI."

At step S18, the microcomputer 20 judges a current state by referring to the LO abnormality flag and the HI abnormality flag. The process moves to step S19 if the LO abnormality flag is "0" and the HI abnormality flag is "0," and to step S20 in the other cases.

At step S19, the microcomputer 20 judges that the switch device 11 is normal. At step S20, the microcomputer 20 judges that the switch device 11 is short-circuited. In actuality, also when the switch device 11 is in an abnormal state other than a short-circuit state, the microcomputer 20 detects it by executing step S20.

For example, if the switch device 11 is in an open failure (disconnection between the drain electrode and the source electrode), the voltage of the sense signal SG3 is at the "GND" level when the binary signal SG1 is "LO." However, the voltage of the sense signal SG3 remains at the "GND" level even when the binary signal SG1 turns to "HI." In this case, the process moves to step S20 because the HI abnormality flag is "1" though the LO abnormality flag is "0."

At step S21, the microcomputer 20 performs prescribed processing that needs to be performed when the switch device 11 is a short circuit state. For example, the microcomputer 20 announces the occurrence of the abnormality by turning on or flashing a display lamp that can be determined visually by a user. Furthermore, the microcomputer 20 stops the energization control on the load 50 that is connected to the electronic control unit 100.

That is, in the first detection mode, the process moves to step S19 if all the conditions are satisfied that should be satisfied for the switch device 11 to be normal. If not, it is judged that the switch device 11 is abnormal.

<Second Detection Mode>

Like the process shown in FIG. 3, a process shown in FIG. 4 employs an LO abnormality flag and an HI abnormality flag, both of which are cleared to "0" before execution of the process of FIG. 4, that is, in an initial state.

At step S31 shown in FIG. 4, the microcomputer 20 judges whether the binary signal SG1 which is applied to the control input terminal 10c of the power semiconductor device 10 is "HI" or "LO." Since the HI/LO state or the binary signal SG1 is the same as that of the binary signal that the microcomputer 20 itself outputs to the output port 20a, actually the microcomputer 20 judges whether the binary signal that it outputs to the output port 20a is "HI" or "LO." The process moves to step S32 if the binary signal SG1 is "LO," and to step S35 if the binary signal SG1 is "HI."

Steps S32, S33, and S34 in FIG. 4 are the same as the respective steps S12, S13, and S14 in FIG. 3 and hence will not be described.

At step S35, the microcomputer 20 detects a voltage of the sense signal SG3 at the analog input port 20b and compares the detected voltage with a predetermined threshold value to judge whether or not the voltage of the sense signal SG3 is within a range of the "GND" level (i.e., equivalent to the "GND" potential). The process moves to step S37 if the voltage of the sense signal SG3 is within the range of the "GND" level, and to step S36 if it is not.

At step S36, the microcomputer 20 clears the HI abnormality flag to "0" to store information to the effect that the switch device 11 is normal in the state that the binary signal SG1 is "HI."

At step S37, the microcomputer 20 sets the HI abnormality flag to "1" to store information to the effect that the switch device 11 is abnormal in the state that the binary signal SG1 is "HI."

If it was detected at step S33 that the switch device 11 is normal in the state that the binary signal SG1 is "LO" or it was detected at step S36 that the switch device 11 is normal in the state that the binary signal SG1 is "HI," the process moves to step S38, where the microcomputer 20 judges that switch device 11 is normal.

On the other hand, if it was detected at step S34 that the switch device 11 is abnormal in the state that the binary signal SG1 is "LO" or it was detected at step S37 that the switch device 11 is abnormal in the state that the binary signal SG1 is "HI," the process moves to step S39, where the microcomputer 20 judges that switch device 11 is short-circuited.

In actuality, if the switch device 11 is in an abnormal state other than a short-circuit state, the microcomputer 20 detects it by executing step S39. That is, if the switch device 11 is short-circuited (between the drain electrode and the source electrode), the voltage of the sense signal SG3 should have a level other than the "GND" level when the binary signal SG1 is "LO." Therefore, an abnormality is detected at step S34 and the process moves to step S39. If the switch device 11 is in an open failure (disconnection between the drain electrode and the source electrode), the voltage of the sense signal SG3 should be at the "GND" level when the binary signal SG1 is "HI." Therefore, an abnormality is detected at step S37 and the process moves to step S39. Step S40 is the same as step S21 shown in FIG. 3.

That is, in the second detection mode, the process moves to step S39 if one condition is satisfied that is satisfied when the switch device 11 is abnormal. The process moves to step S38 if the conditions are satisfied that should be satisfied for the switch device 11 to be normal.

The process of FIG. 4 assumes a situation that the HI/LO state of the binary signal SG1 does not vary frequently. Where the HI/LO state of the binary signal SG1 varies frequently, there may occur an event that steps S38 and S39 shown in FIG. 4 are executed alternately. Special processing needs to be done to prevent such an event. One candidate is to prohibit the process from moving to step S38 until passage of a prescribed time from execution of step S39.

As described above, in each of the first detection mode and the second detection mode, occurrence/non-occurrence of a failure in the switch device 11 can be determined without the need for direct monitoring of a voltage at the output terminal 10b or a current flowing through the load 50.

Embodiment 2

<Special Load>

Where the electronic control unit 100 controls an ordinary load, occurrence/non-occurrence of a failure in the switch device 11 can be determined correctly according to the conditions shown in FIG. 2. However, there may occur a case that a special load 50a is connected to the output terminal 100a of the electronic control unit 100.

Figure 5:
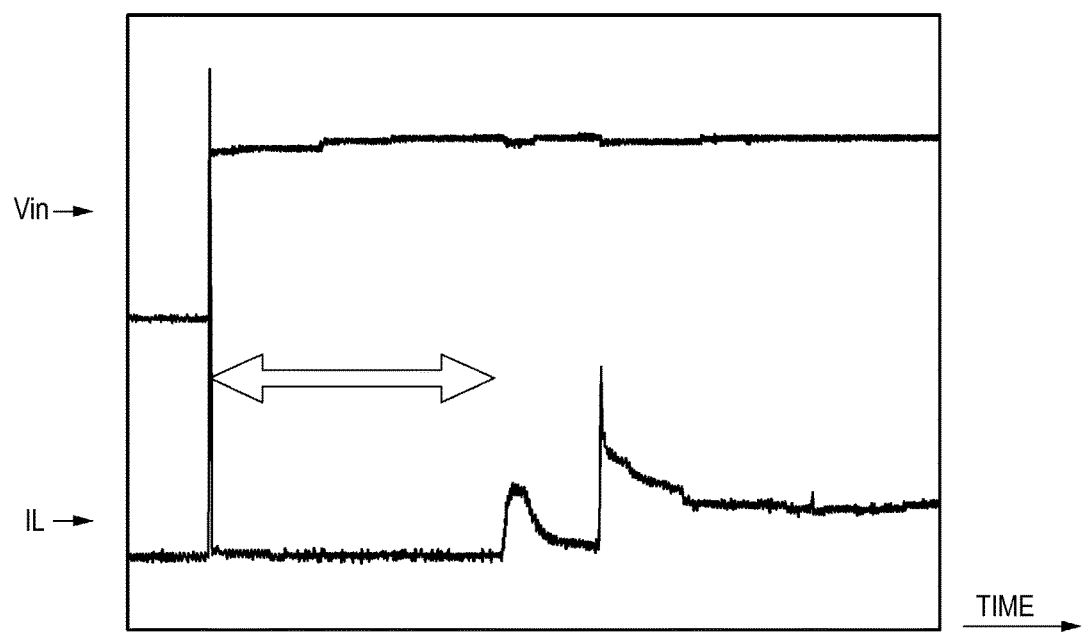
FIG. 5 is a time chart illustrating a specific example relationship between an application voltage and a load current in a case that a special load is used.

FIG. 5 shows a specific example relationship between an application voltage Vin and a load current IL in a case that a special load is connected to the output terminal 100a. The application voltage Vin is a voltage that is applied to the load 50, that is, a potential difference between the output terminal 100a and the ground line 71. The load current IL is a current that flows through the load 50 actually.

Figure 1A:
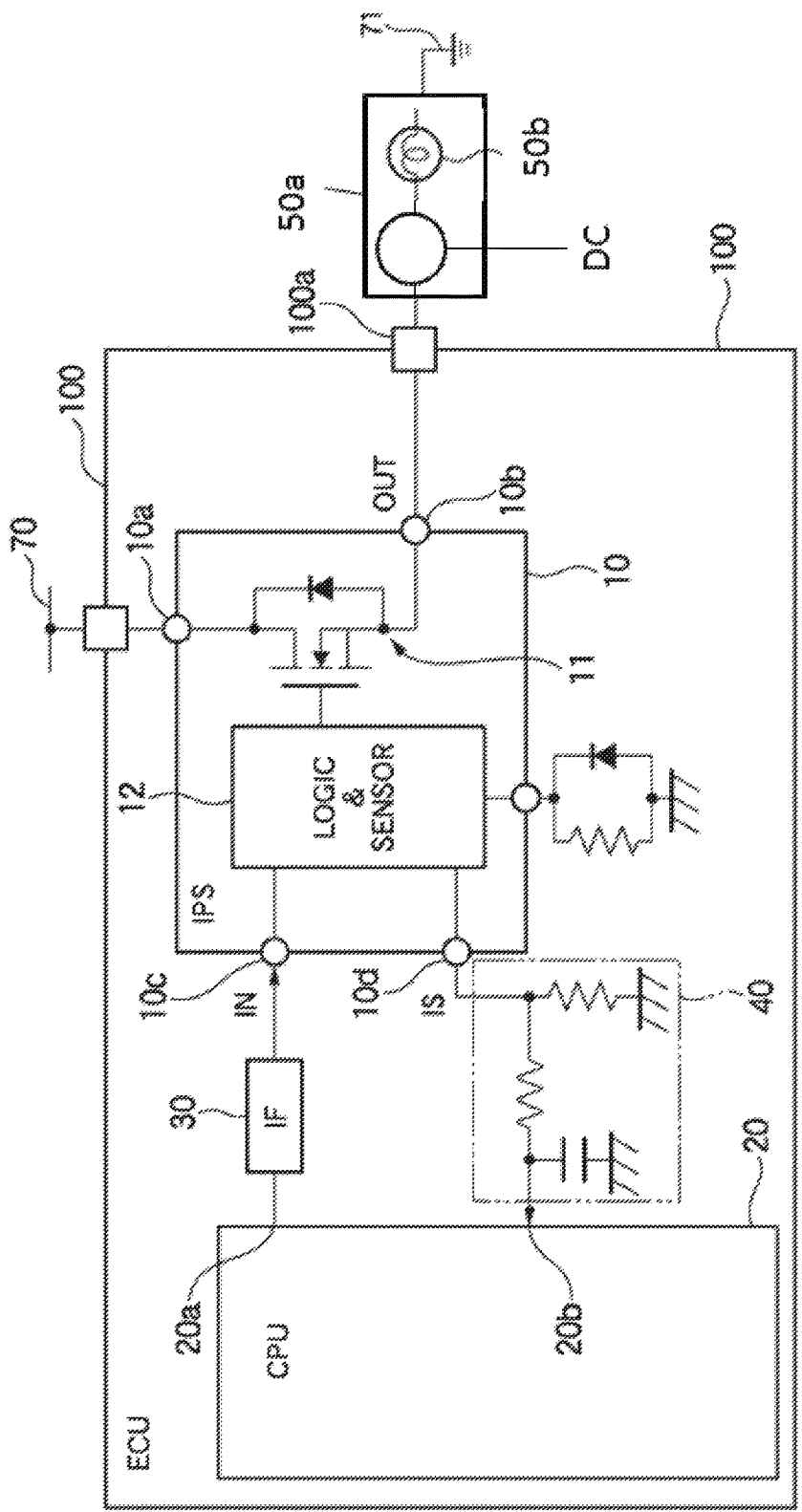
FIG. 1A is a block diagram showing the configuration of an electronic control unit (example configuration (2)) including a semiconductor abnormally detection circuit and a special load.

Example special loads 50a are an HID (high-intensity discharge) lamp and an LED (light-emitting diode) lamp that are provided in vehicles. These loads are not simple loads but electric devices incorporating a drive circuit DC (FIG. 1A). The drive circuit DC generates a voltage necessary to drive a load 50b on the basis of an input voltage and supplies the generated voltage to the load provided in the electric device. Therefore, almost no current (load current IL) flows for a certain time (a delay time indicated by an arrow in FIG. 5) after application of a power source voltage (application voltage Vin) to the electric device and then an ordinary current flows through the load. Among these electric devices are ones in which load on/off switching is performed with independent timing within the electric device.

Therefore, as shown in FIG. 5, after a rise of the application voltage Vin from a low level to a high level, the load current IL rises from around 0 to a rated value after a lapse of a delay time that is determined by the characteristic of the electric device.

<Semiconductor Abnormality Detection Circuit>

Where a special load having a characteristic as shown in FIG. 5 is connected to the electronic control unit 100, since a deviation exists between the application voltage Vin and the load current IL, occurrence/non-occurrence of a failure in the switch device 11 cannot be determined correctly by applying the judgment conditions shown in FIG. 2 as they are.

Figure 6:
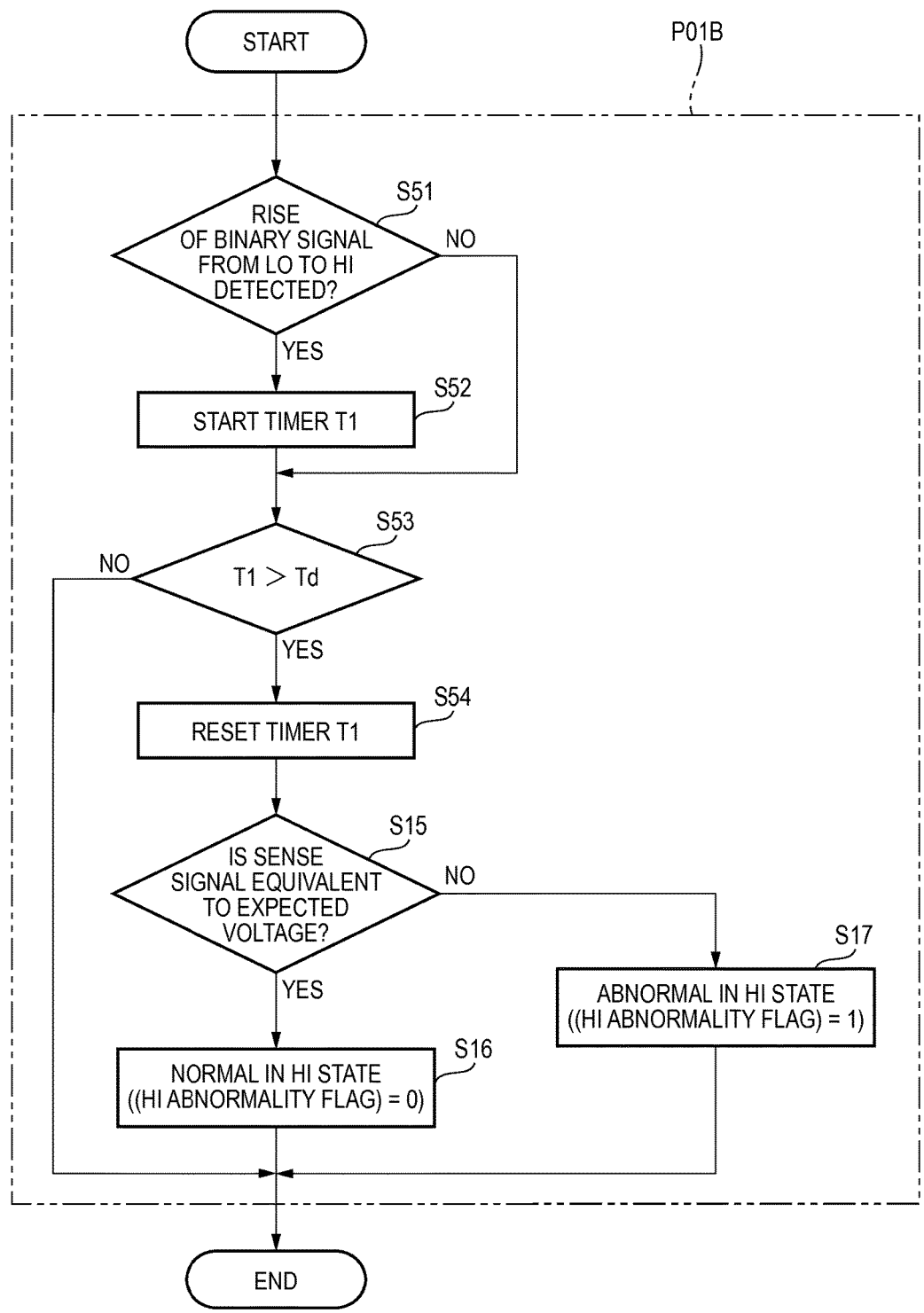
FIG. 6 is a flowchart of a modified version of part of the process shown in FIG. 3.
Figure 7:
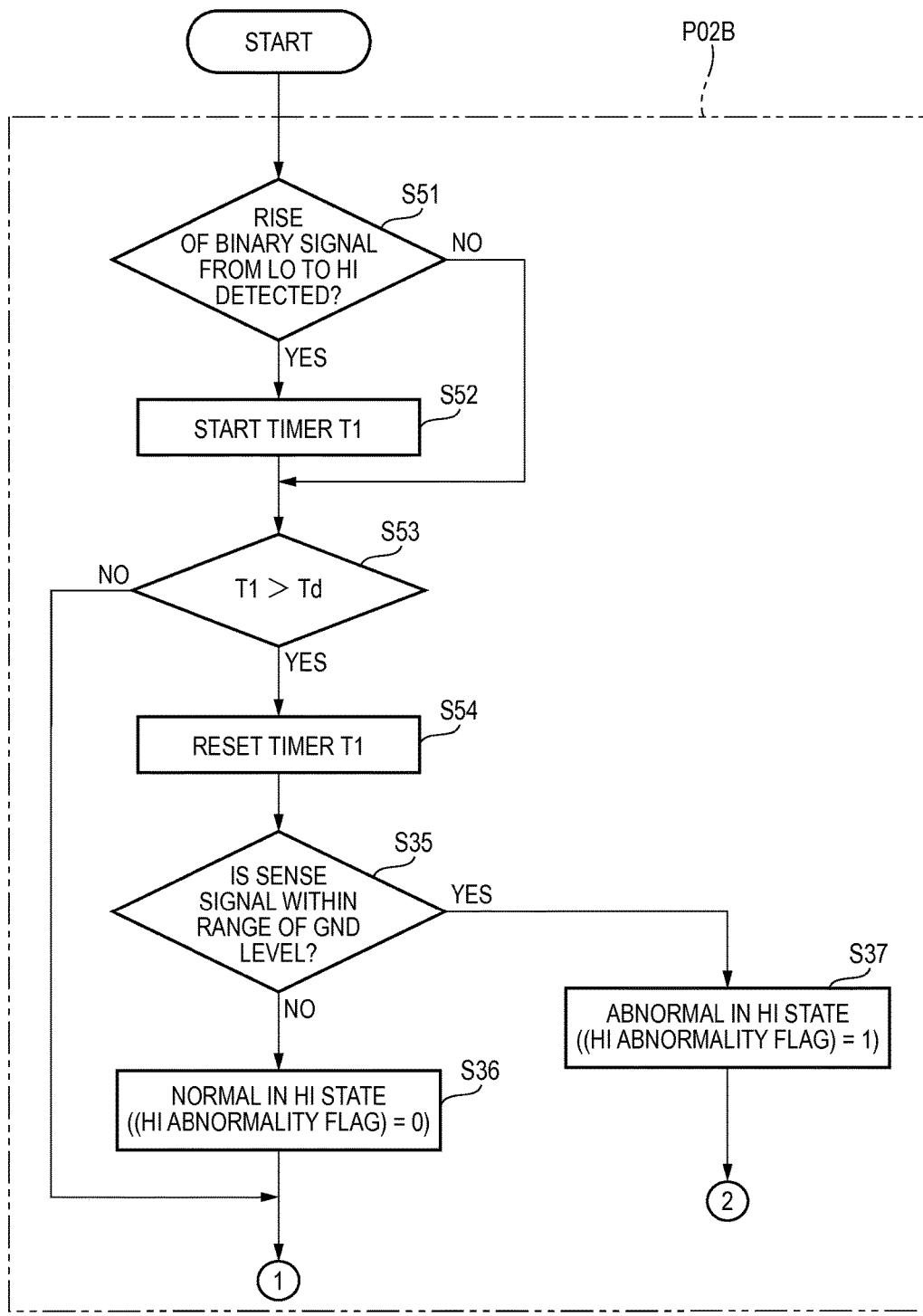
FIG. 7 is a flowchart of a modified version of part of the process shown in FIG. 4.

In view of the above, in a second embodiment, assuming connection of a special load to the output terminal 100a of the electronic control unit 100, part of the process that is executed by the microcomputer 20 is modified as shown in FIG. 6 or 7.

A process P01B shown in FIG. 6 is a modified version of the partial process P01 shown in FIG. 3. A process P02B shown in FIG. 7 is a modified version of the partial process P02 shown in FIG. 4.

That is, in the second embodiment, the microcomputer 20 executes the process P01B instead of the process P01 in the first detection mode and executes the process P02B instead of the process P02 in the second detection mode. The second embodiment is the same as the first embodiment in the other respects.

<Process P01B>

As shown in FIG. 6, at step S51, the microcomputer 20 judges whether a rise, from "LO" to "HI," of the binary signal SG1 (IN input) applied to the control input terminal 10c of the power semiconductor device 10 has been detected or not. Actually, the microcomputer 20 detects a state of the binary signal that the microcomputer 20 itself outputs to the output port 20a.

If a rise of the binary signal SG1 is detected, at step S52 the microcomputer 20 starts operation of an internal timer T1.

At step S53, the microcomputer 20 compares a time measured by the internal timer T1 with a threshold time Td. The threshold time Td is a time that is longer than a delay time corresponding to a rise time deviation between the application voltage Vin and the load current IL shown in FIG. 5. Since the characteristic of the load 50 that is connected actually to the electronic control unit 100 can be known in advance, a time that is longer than a delay time corresponding to the characteristic of the load 50 is registered in the microcomputer 20 as a constant to be used as the threshold time Td.

If a condition T1>Td is satisfied after passage of time from the detection of the rise of the binary signal SG1, the process moves from S53 to step S54, where the microcomputer 20 resets the internal timer T1. As in the process P01 shown in FIG. 3, the microcomputer 20 executes step S15 and then executes step S16 or S17 depending on a judgment result of step S15.

That is, when the voltage of the binary signal SG1 is "HI," step S15 is executed after the load current IL has risen actually (after a lapse of the delay time) (see FIG. 5), discrimination between "normal in an HI state" and "abnormal in an HI state" can be made correctly.

<Process P02B>

In the process of FIG. 7, as in the process of FIG. 6, at step S51 the microcomputer 20 judges whether a rise, from "LO" to "HI," of the binary signal SG1 (IN input) applied to the control input terminal 10c of the power semiconductor device 10 has been detected or not. Actually, the microcomputer 20 detects a state of the binary signal that the microcomputer 20 itself outputs to the output port 20a.

If a rise of the binary signal SG1 is detected, at step S52 the microcomputer 20 starts operation of an internal timer T1.

At step S53, the microcomputer 20 compares a time measured by the internal timer T1 with a threshold time Td. The threshold time Td is a time that is longer than a delay time corresponding to a rise time deviation between the application voltage Vin and the load current IL shown in FIG. 5. Since the characteristic of the load 50 that is connected actually to the electronic control unit 100 can be known in advance, a time that is longer than a delay time corresponding to the characteristic of the load 50 is registered in the microcomputer 20 as a constant to be used as the threshold time Td.

If a condition T1>Td is satisfied after passage of time from the detection of the rise of the binary signal SG1, the process moves from S53 to step S54, where the microcomputer 20 resets the internal timer T1. As in the process P02 shown in FIG. 4, the microcomputer 20 executes step S35 and then executes step S36 or S37 depending on a judgment result of step S35.

That is, when the voltage of the binary signal SG1 is "HI," step S35 is executed after the load current IL has risen actually (after a lapse of the delay time) (see FIG. 5), discrimination between "normal in an HI state" and "abnormal in an HI state" can be made correctly.

Embodiment 3

<Situation of Application of Embodiment 3>

Many of loads (electric devices) provided in vehicles are in an unenergized state (i.e., a state that power is not supplied from the power source) while the vehicle is not in operation. Each load comes to be supplied with power from the power source when the above-described switch device 11, for example, is turned on in response to a certain trigger input after turning-on of the ignition switch.

On the other hand, the electronic control unit 100 recognizing occurrence/non-occurrence of a failure in the switch device 11 by making a judgment according to the judgment conditions shown in FIG. 2. A correct diagnosis result cannot be obtained unless a judgment is made for both of an "LO" state and an "HI" state of the binary signal SG1.

Therefore, in, for example, a situation that a load remains energized or unenergized for a long time, which means that the binary signal SG1 is kept in an "LO" state and an "HI" state for a long time, it may take long time to obtain a correct diagnosis result.

In view of the above, in a third embodiment, a control is made taking into consideration the order of an "LO" state judgment and an "HI" state judgment and preference between them. This makes it possible to shorten the time necessary to obtain a correct diagnosis result.

Figure 8:
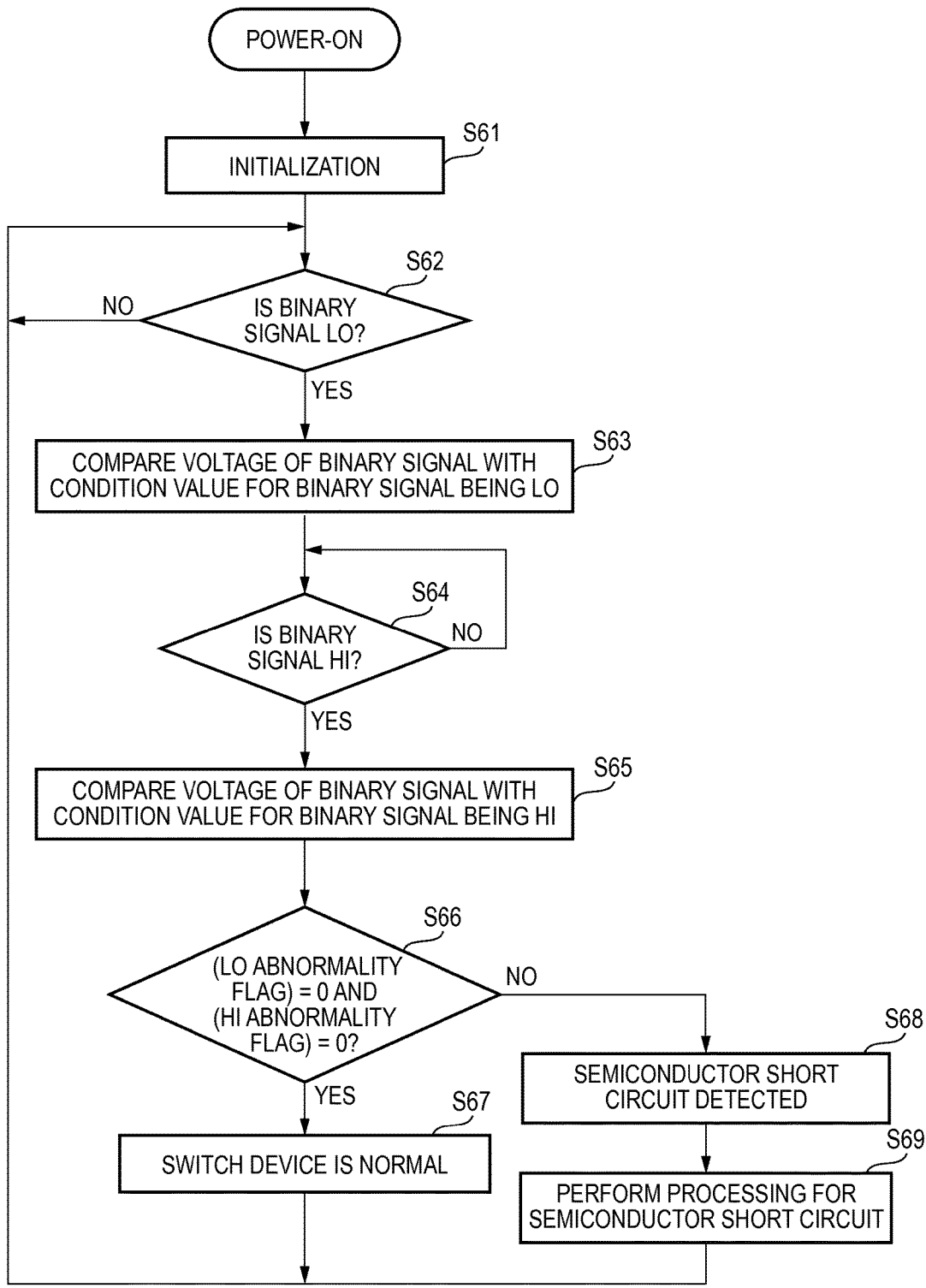
FIG. 8 is a flowchart of a modified version of the process shown in FIG. 3.

FIG. 8 shows a modified version of the process shown in FIG. 3. The microcomputer 20 executed the process of FIG. 8, whereby occurrence/non-occurrence of a failure in the switch device 11 is determined. The configuration of the electronic control unit 100 is the same as shown in FIG. 1.

When the ignition switch of the vehicle is turned on and power is supplied from the vehicle-side power source to the electronic control unit 100, the microcomputer 20 performs prescribed initialization at step S61 shown in FIG. 8. For example, the microcomputer 20 clears the above-described LO abnormality flag and the HI abnormality flag as the initialization.

At step S62, the microcomputer 20 judges whether the voltage of the binary signal SG1 that is applied to the control input terminal 10c of the power semiconductor device 10 is "LO" or not. If the voltage of the binary signal SG1 is "LO," the process moves to step S63.

At step S63, the microcomputer 20 detects the voltage of the sense signal SG3 appearing at the analog input port 20b, compares the detected voltage with the condition value for the binary signal SG1 being "LO," and causes the LO abnormality flag to reflect a comparison result. That is, the microcomputer 20 executes the same steps as steps S12, S13, and S14 shown in FIG. 3 and thereby determines occurrence/non-occurrence of a failure when the voltage of the sense signal SG3 is "LO."

At step S64, the microcomputer 20 judges whether the voltage of the binary signal SG1 that is applied to the control input terminal 10c of the power semiconductor device 10 is "HI" or not. If the voltage of the binary signal SG1 is "HI," the process moves to step S65.

At step S65, the microcomputer 20 detects the voltage of the sense signal SG3 appearing at the analog input port 20b, compares the detected voltage with the condition value for the binary signal SG1 being "HI," and causes the HI abnormality flag to reflect a comparison result. That is, the microcomputer 20 executes the same steps as steps S15, S16, and S17 shown in FIG. 3 and thereby determines occurrence/non-occurrence of a failure when the voltage of the sense signal SG3 is "HI."

Steps S66, S67, S68, and S69 shown in FIG. 8 are the same as respective steps S18, S19, S20, and S21 shown in FIG. 3. That is, the microcomputer 20 detects that the switch device 11 is normal only if the conditions that the LO abnormality flag is "0" and that the HI abnormality flag is "0" are both satisfied. In the other cases, the microcomputer 20 detects a short circuit of the switch device 11.

In the process shown in FIG. 8, a diagnosis in a state that the binary signal SG1 is "LO" is performed at steps S62 and S63 after turning-on of the ignition switch of the vehicle. After completion of this diagnosis, a diagnosis in a state that the binary signal SG1 is "HI" is performed at steps S64 and S65. And a final diagnosis result is produced at steps S66-S69.

Immediately after turning-on of the ignition switch of the vehicle, the binary signal SG1 is necessarily "LO" and the load 50 is not conductive. The binary signal SG1 turns to "HI" in response to a certain trigger input and the load 50 turns conductive. Performing a failure diagnosis in the order shown in FIG. 8 makes it possible to obtain diagnosis results in a state that the binary signal SG1 is "LO" and a state that the binary signal SG1 is "HI" in a minimum necessary time.

Embodiment 4

<Configuration of ECU>

Figure 9:
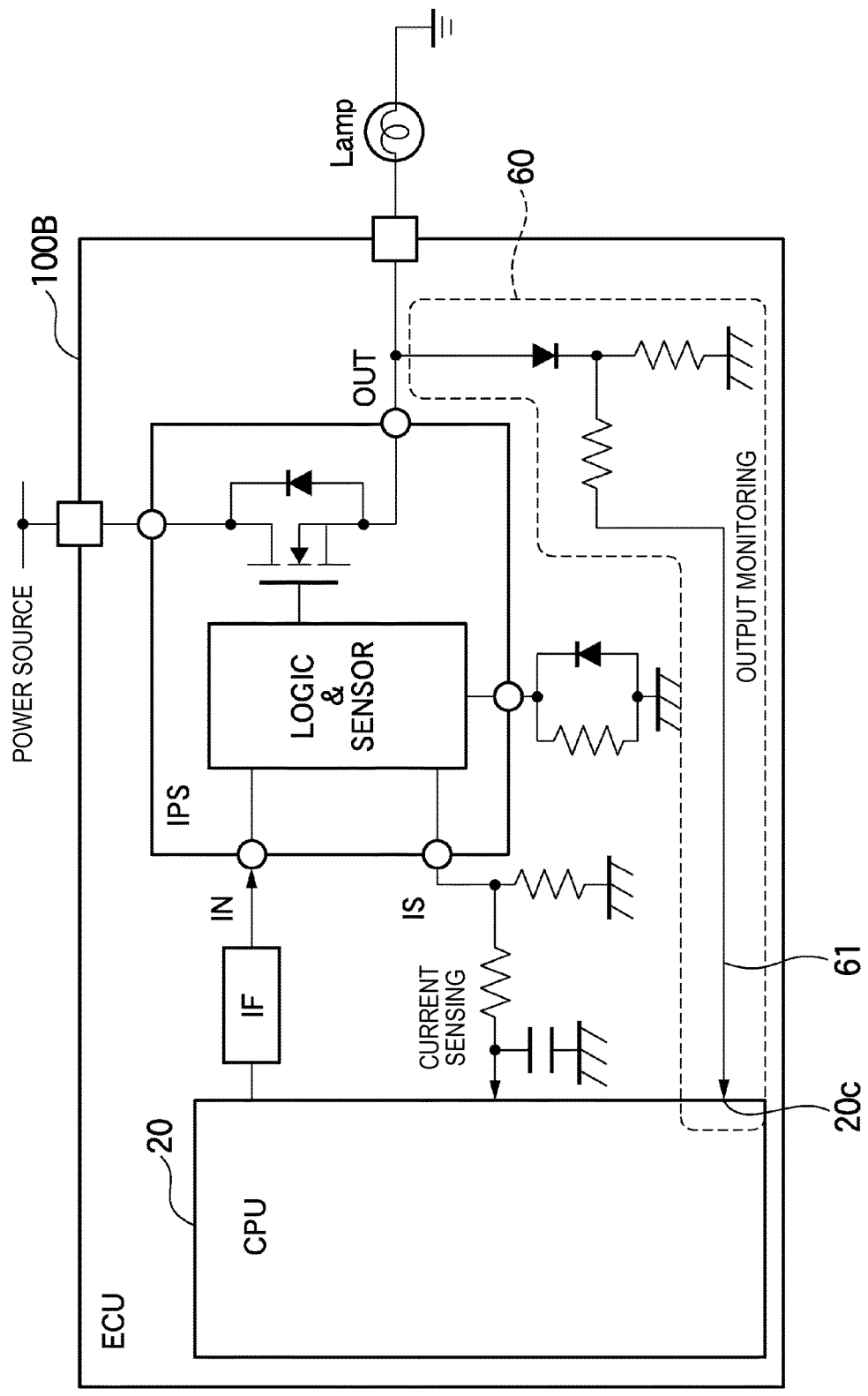
FIG. 9 is a block diagram showing the configuration of an electronic control unit (example configuration (2)) including a semiconductor abnormality detection circuit.

FIG. 9 shows the configuration of an electronic control unit 100B (example configuration (2)) including a semiconductor abnormality detection circuit. The configuration shown in FIG. 9 is a modified version of the configuration shown in FIG. 1, and is different from the latter in addition of an output monitor circuit 60. The configuration of FIG. 9 is almost the same as that of FIG. 1 in the other respects.

As shown in FIG. 9, the input of the output monitor circuit 60 is connected to the output terminal 10b. That is, the output monitor circuit 60 is provided to monitor the voltage at the output terminal 10b. The voltage at the output terminal 10b is applied to an analog input terminal 20c of the microcomputer 20 via a monitoring signal line 61.

Therefore, in the electronic control unit 100B shown in FIG. 9, the microcomputer 20 can monitor both of the voltage of the sense signal SG3 and the output signal SG2 appearing at the output terminal 10b.

<Failure Detecting Operation>

A diagnosis can be performed using the judgment conditions shown in FIG. 2 also when the electronic control unit 100B shown in FIG. 9 determines occurrence/non-occurrence of a failure on the basis of the output signal SG2 appearing at the output terminal 10b. That is, the switch device 11 can be regarded as normal if the voltage of the output signal SG2 appearing at the output terminal 10b is within the range of the "GND" level when the binary signal SG1 is "LO," and abnormal if the voltage of the output signal SG2 is equivalent to "HI" when the binary signal SG1 is "LO."

In a state that the binary signal SG1 is "HI," the switch device 11 may be normal if the voltage of the output signal SG2 is equivalent to "HI," and may be suffering a disconnection or be deteriorated if the output signal SG2 has a voltage other than "HI."

The electronic control unit 100B shown in FIG. 9 enables a more accurate failure diagnosis because of the use of two systems of signals, that is, the output signal SG2 appearing at the output terminal 10b and the sense signal SG3.

Embodiment 5

In the electronic control unit 100 shown in FIG. 1, the microcomputer 20 which has the function of detecting occurrence/non-occurrence of a failure in the switch device 11 is provided outside the power semiconductor device 10. However, it is not always necessary to use a computer to implement such a failure detecting function.

Therefore, in a fifth embodiment, the power semiconductor device 10 itself incorporates a control circuit for realizing such a failure detecting function, although no drawing dedicated to description of this embodiment is provided. The control circuit executes a process that is equivalent to the process shown in FIG. 3 or 4. That is, the control circuit monitors the voltage of the sense signal SG3 and determines occurrence/non-occurrence of a failure by switching the threshold value to be compared with the voltage of the sense signal SG3 according to whether the binary signal SG1 appearing at the control input terminal 10c is "HI" or "LO." As such, the fifth embodiment can omit the microcomputer 20.

The features of the semiconductor abnormality detection circuits according to the embodiments of the invention will be summarized below concisely in the form of items (1)-(7):

(1) A semiconductor abnormality detection circuit comprising:
a semiconductor circuit (power semiconductor device 10) including:
a switch device (11) disposed in a conductive path between a power source (power line 70) and a load (50); and
a sense signal generator (logic/sensor circuit 12) which generates a sense signal corresponding to a current flowing through the switch device; and
a controller (power semiconductor device 10 or microcomputer 20) which controls supply of power to the load by binarily switching between high and low levels of an instruction voltage (binary signal SG1) that is applied to a control input terminal of the switch device,
wherein the controller judges that the semiconductor circuit is operating normally if the instruction voltage level is equal to an off-voltage corresponding to non-energization of the switch device and a voltage of the sense signal is equivalent to a prescribed off-voltage corresponding to non-energization of the switch device or the instruction voltage level is equal to an on-voltage corresponding to energization of the switch device and a voltage of the sense signal is equivalent to a prescribed on-voltage corresponding to a steady energization state of the load.

(2) The semiconductor abnormality detection circuit according to item (1), wherein the controller judges that the semiconductor circuit is operating normally if the voltage of the sense signal is equivalent to the prescribed off-voltage when the instruction voltage level is equal to the off-voltage and the voltage of the sense signal is equivalent to the prescribed on-voltage when the instruction voltage level is equal to the on-voltage.

(3) The semiconductor abnormality detection circuit according to item (2), wherein the controller detects a voltage of the sense signal when the instruction voltage level is equal to the off-voltage and then detects a voltage of the sense signal when the instruction voltage level is equal to the on-voltage.

(4) The semiconductor abnormality detection circuit according to any one of items (1) to (3), further comprising:
a control circuit (microcomputer 20) configured to communicate a signal with the semiconductor circuit,
wherein the control circuit includes the controller.

(5) The semiconductor abnormality detection circuit according to any one of items (1) to (3), wherein the semiconductor circuit (power semiconductor device 10) includes the controller.

(6) The semiconductor abnormality detection circuit according to item (4), further comprising:
a monitor signal line (61) through which a signal equivalent to a voltage appearing at an output terminal (10b) of the switch device is input to the control circuit,
wherein the control circuit judges whether the semiconductor circuit is operating normally based on the voltage of the sense signal (SG3) and a voltage (output signal SG2) that is received through the monitor signal line.

(7) The semiconductor abnormality detection circuit according to any one of items (1) to (6), wherein the controller detects a voltage of the sense signal after waiting until passage of at least a predetermined delay time (threshold time Td) from a change of the instruction voltage level to the on-voltage.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2013-254921 filed on Dec. 10, 2013, the contents of which are incorporated herein by reference.

What is claimed is:
1. A semiconductor abnormality detection circuit comprising:
a semiconductor circuit including:
a switch device disposed in a conductive path between a power source and a load; and
a sense signal generator configured to generate a sense signal corresponding to a current flowing through the switch device; and
a controller configured to control supply of power to the load by binarily switching between high and low levels of an instruction voltage that is applied to a control input terminal of the switch device,
wherein the controller is configured to judge that the semiconductor circuit is operating normally if the instruction voltage level is equal to an off-voltage corresponding to non-energization of the switch device and a voltage of the sense signal is equivalent to a prescribed off-voltage corresponding to non-energiza- tion of the switch device or the instruction voltage level is equal to an on-voltage corresponding to energization of the switch device and a voltage of the sense signal is equivalent to a prescribed on-voltage corresponding to a steady energization state of the load, wherein the controller is configured to detect a voltage of the sense signal after waiting until passage of at least a predetermined delay time from a change of the instruction voltage level to the on voltage, and wherein the predetermined delay time includes a delay time associated with the load including a drive circuit generating a voltage necessary to drive a load on a basis of an input voltage and supplying a generated voltage.

2. The semiconductor abnormality detection circuit according to claim 1, wherein the controller is configured to judge that the semiconductor circuit is operating normally if the voltage of the sense signal is equivalent to the prescribed off-voltage when the instruction voltage level is equal to the off-voltage and the voltage of the sense signal is equivalent to the prescribed on-voltage when the instruction voltage level is equal to the on-voltage.

3. The semiconductor abnormality detection circuit according to claim 2, wherein the controller detects a voltage of the sense signal when the instruction voltage level is equal to the off-voltage and then detects a voltage of the sense signal when the instruction voltage level is equal to the on-voltage.

4. The semiconductor abnormality detection circuit according to claim 1, further comprising:
   a control circuit configured to communicate a signal with the semiconductor circuit,
   wherein the control circuit includes the controller.

5. The semiconductor abnormality detection circuit according to claim 1, wherein the semiconductor circuit includes the controller.

6. The semiconductor abnormality detection circuit according to claim 4, further comprising:
   a monitor signal line through which a signal equivalent to a voltage appearing at an output terminal of the switch device is input to the control circuit,
   wherein the control circuit is configured to judge whether the semiconductor circuit is operating normally based on the voltage of the sense signal and a voltage that is received through the monitor signal line.

* * * * *